United States Patent
Torii et al.

[19]

[11] Patent Number: 6,097,051
[45] Date of Patent: Aug. 1, 2000

[54] SEMICONDUCTOR DEVICE AND METHOD OF FABRICATING

[75] Inventors: Kazuyoshi Torii; Hiroshi Kawakami, both of Hachioji; Hiroshi Miki, Tokyo; Keiko Kushida, Kodaira; Yoshihisa Fujisaki, Fuchu; Masahiro Moniwa, Sayama, all of Japan

[73] Assignee: Hitachi, Ltd., Tokyo, Japan

[21] Appl. No.: 08/755,602

[22] Filed: Nov. 25, 1996

[30] Foreign Application Priority Data

Dec. 5, 1995 [JP] Japan ................................. 7-316342

[51] Int. Cl.⁷ ................................................. H01L 27/108
[52] U.S. Cl. ........................... 257/306; 257/295; 257/310; 438/3; 438/240; 438/253; 438/396
[58] Field of Search ......................... 257/306, 310, 257/295; 438/3, 240, 253, 396; 216/6

[56] References Cited

U.S. PATENT DOCUMENTS

| | | | |
|---|---|---|---|
| 5,443,688 | 8/1995 | Toure et al. | 216/13 |
| 5,541,807 | 7/1996 | Evans, Jr. et al. | 257/295 |
| 5,543,644 | 8/1996 | Abt et al. | 257/296 |
| 5,621,606 | 4/1997 | Hwang | 257/295 |
| 5,679,980 | 10/1997 | Summerfelt | 257/295 |
| 5,801,410 | 9/1998 | Kim | 257/295 |
| 5,834,060 | 11/1998 | Kawahara et al. | 427/255.3 |
| 5,838,605 | 11/1998 | Bailey | 257/295 |

FOREIGN PATENT DOCUMENTS

| | | |
|---|---|---|
| 2-288368 | 11/1990 | Japan . |
| 5-90606 | 4/1993 | Japan . |
| 5-299601 | 11/1993 | Japan . |

*Primary Examiner*—Carl Whitehead, Jr.
*Assistant Examiner*—Toniae M. Thomas
*Attorney, Agent, or Firm*—Antonelli, Terry, Stout & Kraus, LLP

[57] ABSTRACT

A semiconductor device having a bottom electrode, a ferroelectric film, and a top electrode formed on a semiconductor substrate, wherein the angle of each of the main cross sectional sides of the ferroelectric film relative to the main surface of the semiconductor substrate is less than 75 degrees. Forming the ferroelectric film into the trapezoid in cross section having such an angle provides a microscopic capacitor without electrical short-circuit between the top and bottom electrodes if the top electrode, the ferroelectric film, and the bottom electrode are etched with single photolithography process step. The novel technique implements a microscopic memory cell structure suitable for highly integrated memory devices.

18 Claims, 8 Drawing Sheets

THE ANGLE IS LESS THAN 75 DEGREE

O₂ PLASMA

SEMICONDUCTOR DEVICE AND METHOD OF FABRICATING

BACKGROUND OF THE INVENTION

The present invention relates to a semiconductor device having capacitors using a ferroelectric film such as ferroelectric nonvolatile memory or a dynamic rondam access memory (DRAM).

Some ferroelectric materials have extremely large relative dielectric constants ranging from several hundreds to several thousands. Therefore, use of a thin film made of these ferroelectric materials for a capacitor dielectrics provides a capacitor of small area and large capacity suitable for large scale integration (LSI) devices. Also, the ferroelectric material has spontaneous polarization that can be inverted in direction by an applied electric field, thereby providing a nonvolatile memory.

As described in Japanese unexamined Patent Application No. 5-90606 and referring to FIG. 14, the conventional ferroelectric memory is fabricated by forming on an interlayer insulating film 144 with a bottom Pt electrode 145, ferroelectric film 146, and a top Pt electrode 147 in this order, thereby forming a ferroelectric capacitor. However, in the conventional ferroelectric memory, each of the layers is formed with an independent mask, which makes the memory cell area large because of critical dimension uniformity and alignment tolerance, thereby making it difficult to fabricate highly integrated memory devices. The conventional technique also involves a problem of thinning the interlayer insulating film 144 for the conventional technique repeats the patterning on it for forming the ferroelectric capacitors.

To solve the above-mentioned problems, a method was proposed as described in Japanese unexamined Patent Application No. 2-288368, in which a top electrode 158, a ferroelectric film 157, and a bottom electrode 156 are collectively dry-etched with the photoresist used as a mask as shown in FIG. 15. This method uses polysilicon for the top and bottom electrodes 158 and 156, which are dry-etched with $C_2Cl_2F_4$, $SF_6$, and Ar gases.

However, forming a ferroelectric film directly on polysilicon, a silicon oxide film of a low dielectric constant is formed at the interface. The silicon oxide film thus formed significantly deteriorates capacitor characteristics. To avoid this deterioration, it is necessary to use electrodes made of noble metals such as platinum and palladium or conductive oxides such as $IrO_2$, $RuO_2$, and $ReO_3$.

Of the above-mentioned electrode materials, platinum is considered best suited for the application. Therefore, in the memory cell forming process described in Japanese unexamined Patent Application No. 5-299601 collectively dry-etches a top electrode 45, a ferroelectric film 44, a bottom electrode 43, and a conductive diffusion barrier layer 169 with the photoresist used as the mask as shown in FIG. 16. Use of such a structure can implement microscopic capacitors without losing their properties.

Actually, however, platinum cannot be converted to a highly volatile reaction product to be dry-etched. It was observed that, if platinum is dry-etched, a redeposited material forms a wall-shaped residue (hereinafter referred to as a platinum-contained deposit) on the capacitor side wall due to the low volatility. In this structure, the above-mentioned platinum-contained deposits short-circuit the top electrode 45 and the bottom electrode 43.

It is therefore an object of the present invention to provide a capacitor in which the top and bottom electrodes thereof will not be short-circuited when the top electrode, the ferroelectric film, and the bottom electrode are etched with single photolithography process step.

SUMMARY OF THE INVENTION

This object is achieved by setting the taper angle of the side wall of the ferroelectric film constituting the ferroelectric capacitor to less than 75 degrees to the main surface of the substrate on which the ferroelectric capacitor is formed. That is, the taper angle of the cross sidewall of the ferroelectric capacitor to the plane on which the bottom electrode is formed is set to a value not reaching 75 degrees or more.

Referring to FIG. 13, there is shown a relationship between the taper angle of the cross side wall of the ferroelectric capacitor to the main surface of the substrate and short-circuit. It is assumed herein that a short-circuit has occurred when a leakage current density at an applied voltage of 3V became $10^{-5}$ A/cm² or higher. In the above-mentioned prior art, the etching is performed at nearly 90 degrees, so that, after etching of the platinum top electrode 45, the platinum of the top electrode 45 redeposits to form a platinum-contained sidewall deposit 101 as shown in FIG. 10A. After completion of dry-etching of the ferroelectric film 44, a sidewall deposit 102 composed of elements constituting the ferroelectric film 44 remains along the platinum-contained sidewall deposit 101 as shown in FIG. 10B. Although this sidewall deposit 102 is composed of the components of the ferroelectric film, the composition and crystal structure thereof are out of order, resulting in insufficient insulation. Referring to FIG. 10C, during etching of the platinum bottom electrode 43, this deposit 102 composed of the components of the ferroelectric film is mostly removed. However, the platinum-contained sidewall deposit 101 still remains. Further, the platinum-contained sidewall deposit 103 may also be formed from the platinum bottom electrode. Thus, in the prior-art technology, depositing of platinum on the sidewall short-circuits the bottom and top electrodes 43 and 45 of the capacitor.

Referring to FIG. 13, it is clear that setting the angle of the cross sidewall of the platinum bottom electrode, the ferroelectric film and the top electrode to the main surface of the substrate to less than 75 degrees prevents the platinum deposits from being formed on the capacitor sidewall.

In FIG. 13, the angle of the cross sidewall of the platinum bottom electrode, the ferroelectric film, and the top electrode to the main surface of the substrate is shown; however, it is not always necessary to set the cross sectional sidewall of the entire capacitor to less than 75 degrees. For example, tilting the sidewall of only the ferroelectric film 44 relative to the main surface of the substrate by less than 75 degrees also provides an effect of preventing the platinum deposition from occurring. The effect can be made more conspicuous, however, by tilting together the sidewall of the platinum bottom electrode by less than 75 degrees.

It will be apparent that, instead of platinum, the top electrode 45 may be another rare metal such as iridium or ruthenium or a conductive oxide such as $IrO_2$, $RuO_2$, or $ReO_3$. If platinum is not used for the top electrode 45, the platinum-contained deposit is formed on the capacitor sidewall only when the platinum bottom electrode 43 is etched. As described above, tapering the capacitor side walls to the main surface of the substrate by less than 75 degrees prevents the short-circuit between the top electrode and the platinum bottom electrode.

The angle of the cross sidewall of the ferroelectric capacitor to the bottom surface of the bottom electrode is determined by the angle of the etching mask sidewall to the bottom surface of the bottom electrode. In the present invention, tungsten is used for the etching mask. When tungsten is etched by anisotropic dry etching, the angle of the tungsten sidewall to the bottom surface of the bottom electrode is determined by the angle of the photoresist side walls. FIG. 11 shows a relationship between the sidewall taper angle of photoresist sidewall and resist baking temperature. Shown are test results obtained from two types of photoresists A and B. The results indicate that the sidewall taper angle gets larger as the baking temperature rises for both the photoresists. The photoresist A is composed of a material having a flat distribution over molecular weights of 100 to 30,000, while the photoresist B is composed of a material having a peak over molecular weights 2,000 to 3,000. For the photoresists shown, a preferable result is obtained by setting the baking temperature to a range of 140° C. to 160° C. The method of controlling the sidewall taper angle by the resist baking temperature is also applicable to the case in which materials such as $SiO_2$ for which isotropic tapering is difficult is used for the etching mask.

When tungsten is etched by isotropic dry etching, the angle of the tungsten sidewall to the bottom surface of the bottom electrode can be controlled by the over-etching time of tungsten. FIG. 12 shows a relationship between the over-etching time of tungsten and the angle of the tungsten sidewall to the main surface of the substrate. As the tungsten over-etching time is increased, line width becomes narrower, while the sidewall approaches vertical angle. A preferable result will be obtained when the tungsten over-etching time is set to a range of 5% to 10%.

However, when etching the ferroelectric capacitor such that the sidewall taper angle thereof becomes less than 75 degrees relative to the main surface of the substrate, the ferroelectric sidewall is exposed to plasma, which may cause an etching damage, resulting in an increase in the leakage current on the sidewall. This problem is overcome by performing oxygen plasma processing after dry-etching of the bottom electrode and before etching the conductive diffusion barrier layer (hereinafter referred to simply as the diffusion barrier layer).

It should be noted that performing oxidization processing for etching damage recovery after etching TiN of the diffusion barrier layer oxidizes the TiN under the bottom platinum electrode to cause peel-off or the like trouble. The peel-off can be prevented from occurring by performing oxygen plasma processing before etching the TiN.

These above and further objects and features of the invention will be seen by reference to the description, taken in connection with the accompanying drawings.

BRIEF DESCRIPTION OF THE DRAWINGS

In the drawings, forming a part thereof, in which like reference characters denote like parts in the various views.

DETAILED DESCRIPTION OF PREFERRED EMBODIMENT

Figure 1:
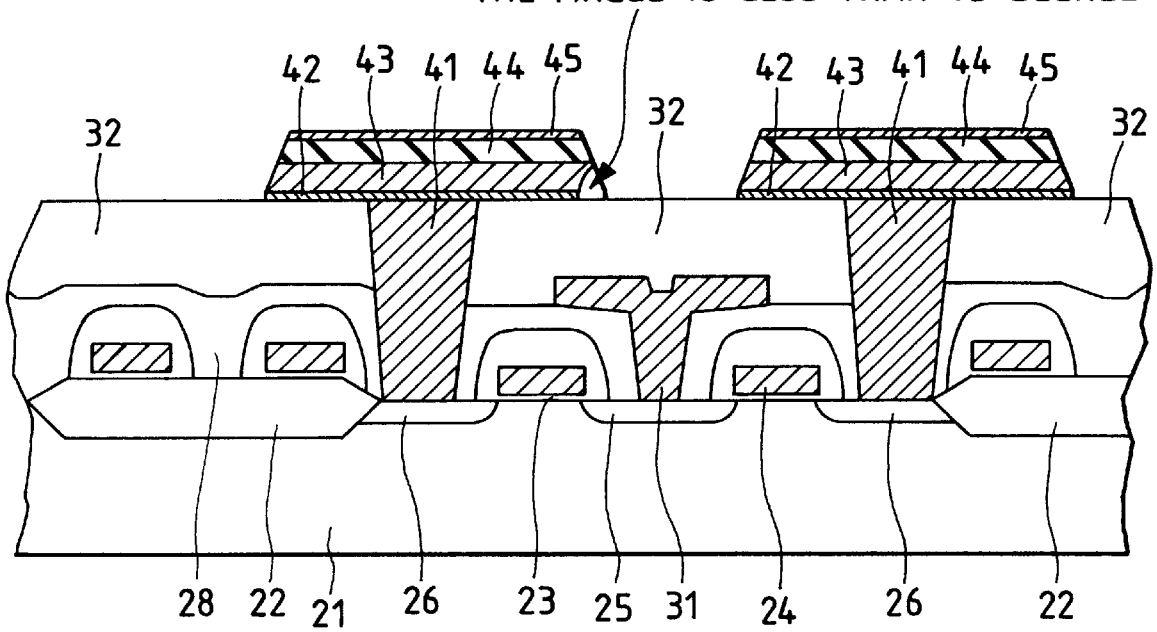
FIG. 1 is a cross section illustrating a semiconductor device according to the present invention.

Now, referring to FIGS. 2 through 8, there are shown cross sections illustrating a method of fabricating a memory of FIG. 1 in the order of main processes, the method being practiced as one preferred embodiment of the present invention.

Figure 2:
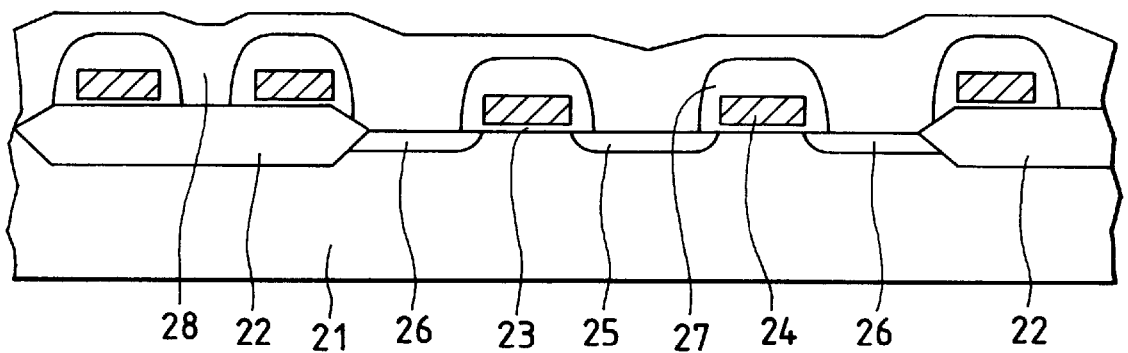
FIG. 2 is a cross section illustrating a process of fabricating a memory cell based on the present invention.

First, as shown in FIG. 2, a switching transistor is formed by the conventional MOSFET (Metal Oxide Semiconductor Field-Effect Transistor) forming process. In the figure, reference numeral 21 indicates a p-type semiconductor substrate, reference numeral 22 indicates an isolation dielectric, reference numeral 23 indicates a gate oxide film, reference numeral 24 indicates a word line that provides a gate electrode, reference numerals 25 and 26 indicate phosphorous-doped n-type regions, and reference numeral 27 indicates an interlayer insulating film. A deposit of $SiO_2$ 28 of about 600 nm in thickness is formed by the known CVD (Chemical Vapor Deposition) all over the transistor. Then, the formed deposit is reflowed at 850° C. to be etched back by about 300 nm, thereby smoothing steps caused by the word line.

Next, an opening is formed in the $SiO_2$ 28 so that a bit line can come into contact with the n-type region 25. The opening is made by known photolithography and dry etching techniques. Then, the bit line 31 is formed. This bit line 31 is composed of a film stack made of metal silicide and polysilicon. This film stack is etched by the known photolithography and dry etching to a desired bit-line pattern.

An insulating film 32 of silicon oxide film type such as BPSG (Boron-doped Phosphor-Silicate Glass) is deposited to planarize. It should be noted that this insulating film 32 needs to be thick enough for to planarize the substrate surface. In the present embodiment, the insulating film 32 was formed to a thickness of about 600 nm and planarized by etching back.

Figure 3:
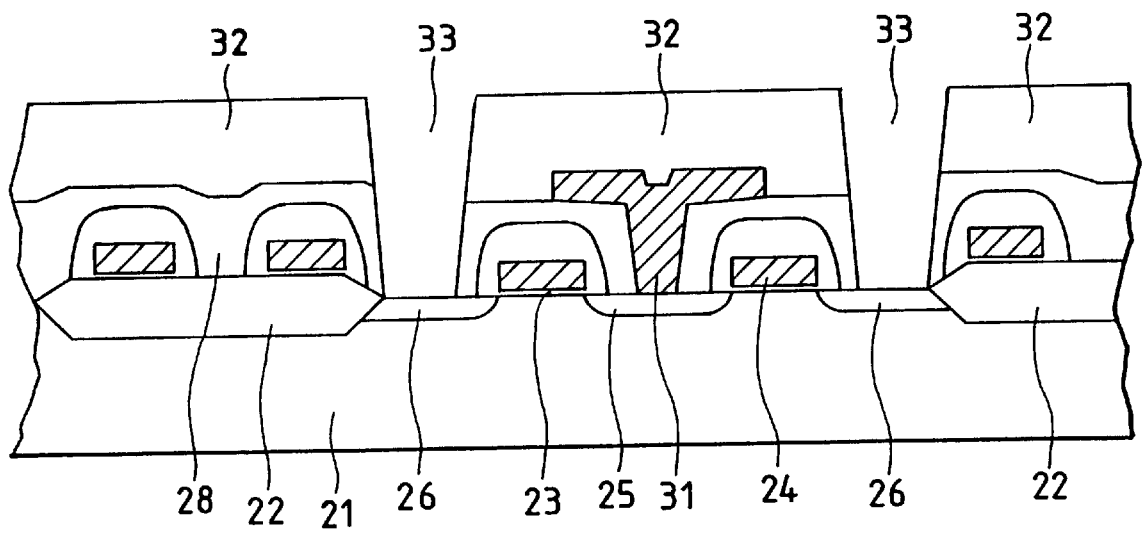
FIG. 3 is a cross section illustrating a fabrication process next to that of FIG. 2.
Figure 4:
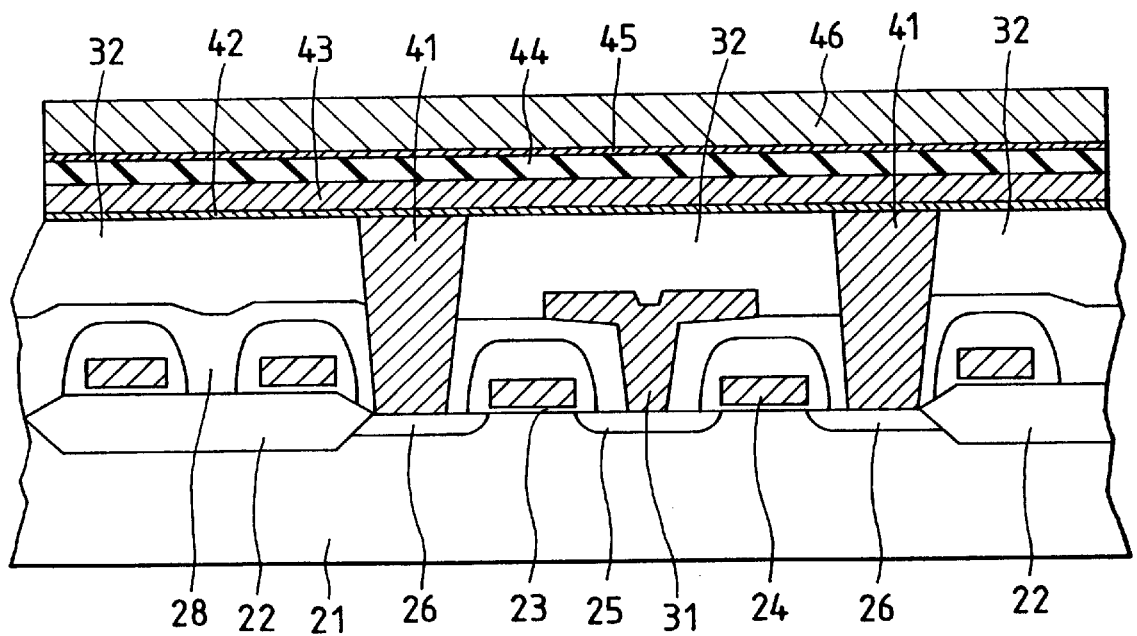
FIG. 4 is a cross section illustrating a fabrication process next to that of FIG. 3.

Referring to FIG. 3, a contact hole 33 of memory section is opened to provide access for the storage capacity section to come into contact with the substrate. On the insulating film 32 and inside the contact hole 33, polysilicon 41 was deposited CVD dry etching to a thickness of about 350 nm. Then, by dry etching, the polysilicon 41 was etched back by the film thickness to fill the contact hole 33 as shown in FIG. 4.

By sputtering, TiN is formed to a thickness of about 50 nm as a diffusion barrier layer 42 and then a bottom electrode 43 is formed. In the present embodiment, a Pt film about 200 nm thick was deposited as the bottom electrode 43. The TiN of the diffusion barrier layer 42 is provided to prevent the platinum of the bottom electrode 43 and the oxygen from diffusing into the polysilicon 41. Then, a ferroelectric film 44 is formed. In the present embodiment, a lead zirconate titanate $(Pb(Zr_{0.5}Ti_{0.5})O_3)$ film was formed to a thickness of about 150 nm by reactive evaporation and then crystallized by heat treatment in oxygen atmosphere at 650° C. for 30 seconds for obtaining the ferroelectric film 44. It will be apparent that the ferroelectric film 44 may also be formed by high-frequency magnetron sputtering, Sol-Gel method, MOD (Metal Organic Decomposition), or CVD. Then, by sputtering, a Pt film about 50 nm thick was formed as a top electrode 45 and a tungsten 46 was deposited to a thickness of about 350 nm for the mask as shown in FIG. 4.

Figure 5:
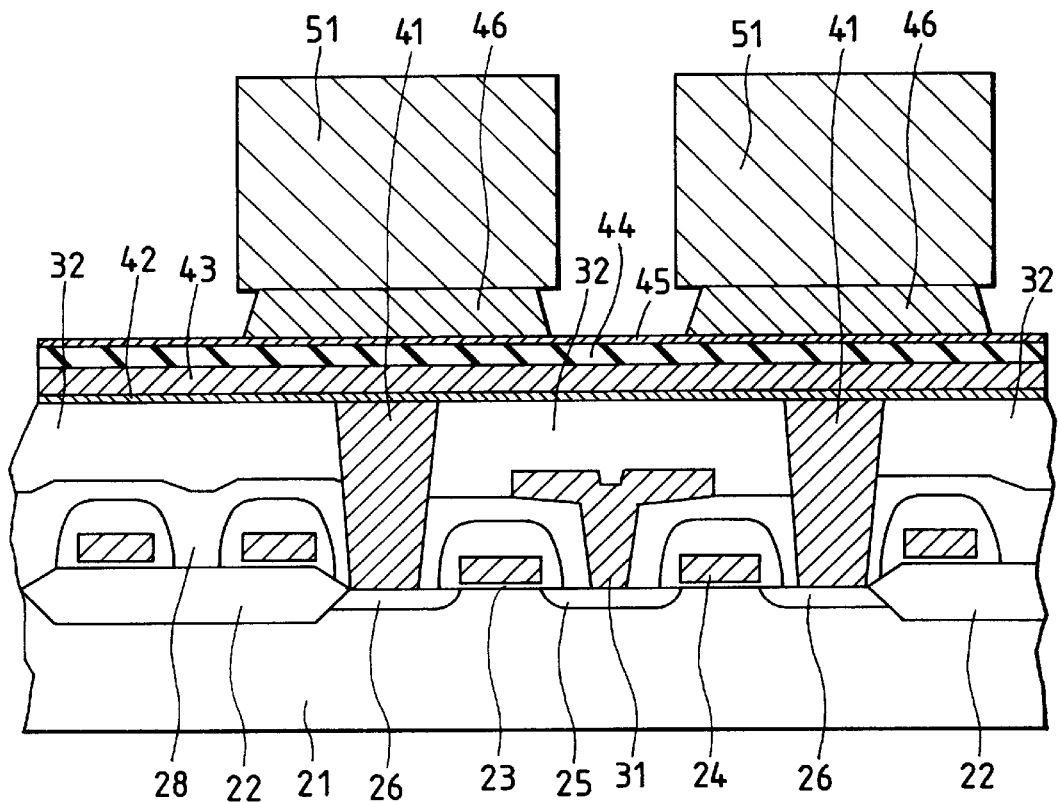
FIG. 5 is a cross section illustrating a fabrication process next to that of FIG. 4.
Figure 6:
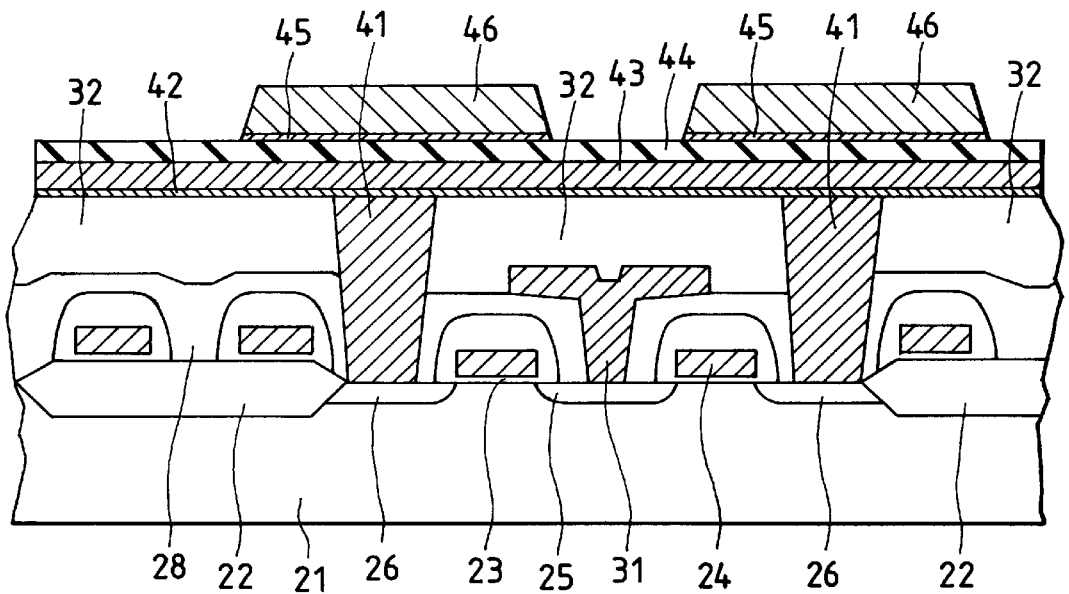
FIG. 6 is a cross section illustrating a fabrication process next to that of FIG. 5.

Referring to FIG. 5, the tungsten 46 is patterned by dry-etching with $SF_6$, a photoresist 51 being used as the mask. After the photoresist 51 has been removed, the top electrode 45 is patterned by the sputter etching with the tungsten 46 used as the mask as shown in FIG. 6. In doing so, the dry etching conditions were adjusted such that isotropic etching is provided, and the etching was performed such that the cross section of the tungsten 46 becomes a trapezoid, the angle of each of the sides thereof relative to the substrate being less than 75 degrees. In the present embodiment, microwave dry etching was used with the conditions that an $SF_6$ gas flow of 10 SCCM, a pressure of 2 mTorr, and a microwave power of 400 W.

Figure 10A:
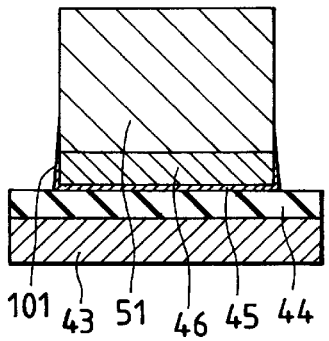
FIG. 10A is a cross section illustrating sidewall deposits formed on the capacitor as observed after dry-etching the top electrode.
Figure 10B:
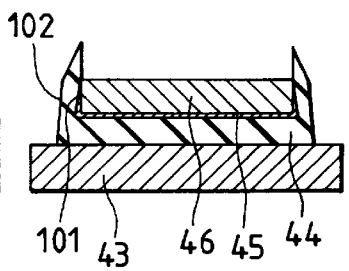
FIG. 10B is a cross section illustrating sidewall deposits formed on the capacitor as observed after dry-etching the ferroelectric film.
Figure 10C:
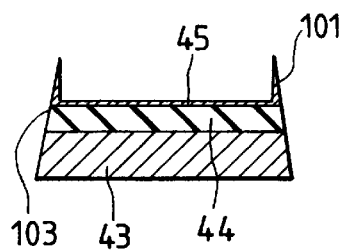
FIG. 10C is a cross section illustrating sidewall deposits formed on the capacitor as observed after dry-etching the bottom electrode.

If the dry etching is performed with high anisotropy, the cross section of the tungsten 46 departs from the trapezoid and approaches a rectangular, leaving projecting deposits on the tungsten 46 and the photoresist 51 at the sidewalls thereof. As shown in FIG. 10A, after the photoresist 51 has been removed, platinum-contained projecting sidewall deposits 101 remain. As shown in FIG. 10B, after the ferroelectric film 44 has been dry-etched, sidewall deposits 102 composed of the components of the ferroelectric film remain on the periphery of the platinum-contained projecting sidewall deposits 101.

When the ferroelectric film 44 has been etched by use of a mixed gas composed of $CF_4$ and Ar, the bottom electrode 43 is etched by sputter etching. It should be noted that 30% over-etching was performed in order to remove the platinum deposited on the sidewalls as shown in FIG. 7.

Figure 8:
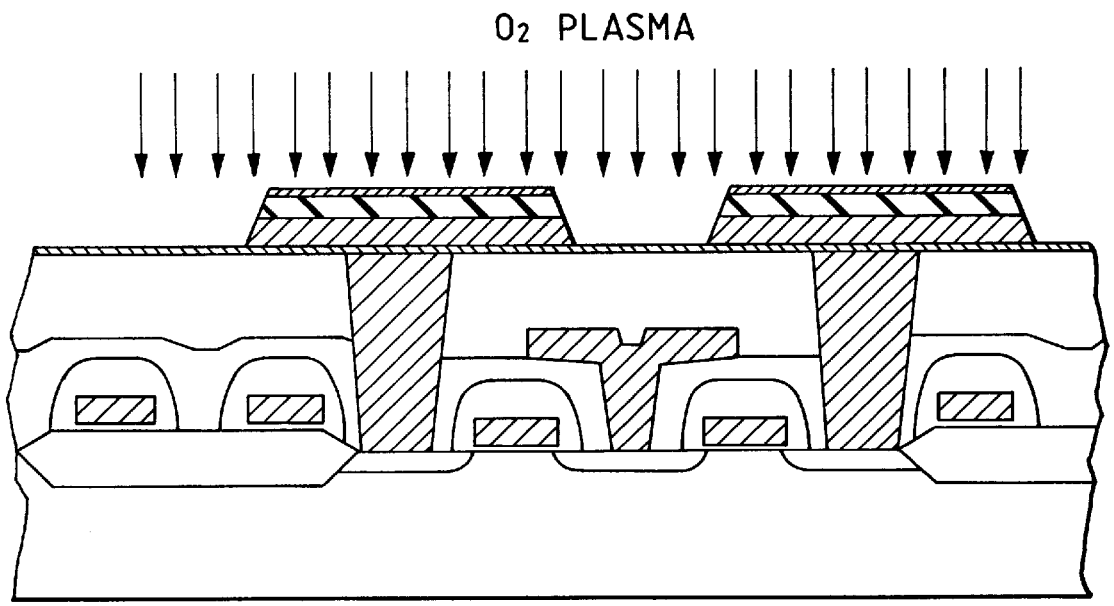
FIG. 8 is a cross section illustrating a fabrication process next to that of FIG. 7.

Oxygen plasma is generated in the same chamber in which the above-mentioned etching was performed to recover the etching damages of the cross section of the ferroelectric film 44. In the present embodiment, the oxygen plasma processing was performed at an oxygen flow of 25 SCCM, a pressure of 30 mTorr, an RF power of 150 W for three minutes as shown in FIG. 8. Then, by the dry etching with $SF_6$, the diffusion barrier layer 42 and the remaining tungsten 46 were removed simultaneously to complete the ferroelectric capacitor of FIG. 1. Although not shown, the memory device is completed by performing wiring like an ordinary semiconductor memory chip.

According to the above-mentioned processes, the increase in leakage current on the sidewalls and the decrease in breakdown voltage can be prevented at the same time, thereby allowing fabrication of microscopic ferroelectric memory cells suitable for high integration. The leakage of the ferroelectric capacitor can also be decreased by performing the oxygen plasma processing after etching the diffusion barrier layer 42 by the dry etching using $SF_6$. However, this causes oxidization of the diffusion barrier layer 42 left under the bottom electrode 43 from the sides of the layer, resulting in peeling off of the bottom electrode 43 from the bottom electrode/diffusion barrier layer interface. This problem can be avoided if the oxygen plasma processing is performed before dry-etching the diffusion barrier layer 42.

Figure 7:
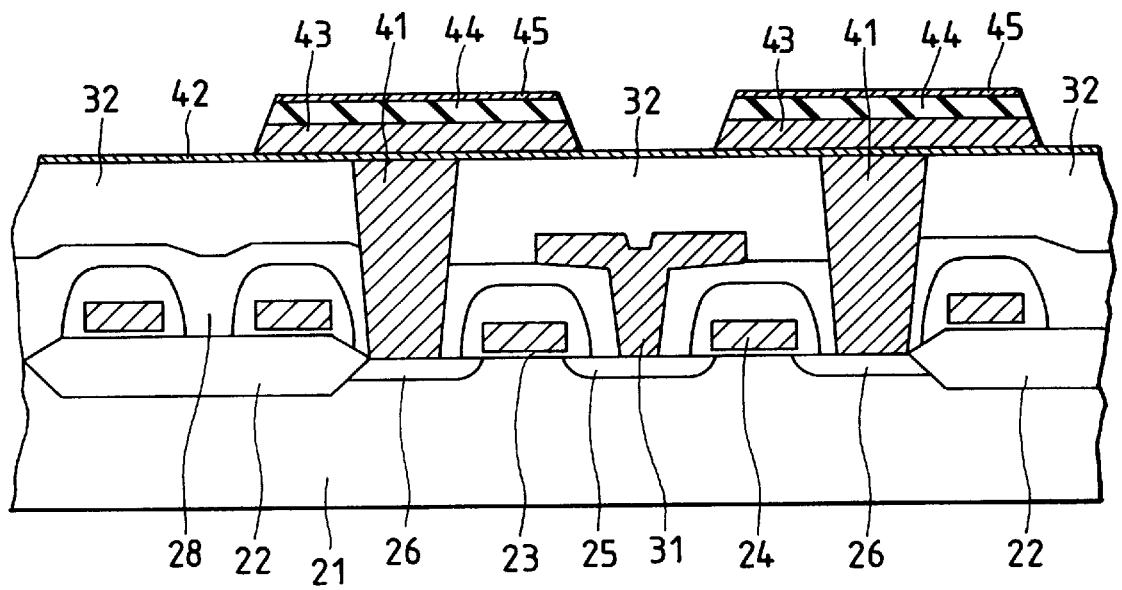
FIG. 7 is a cross section illustrating a fabrication process next to that of FIG. 6.
Figure 9:
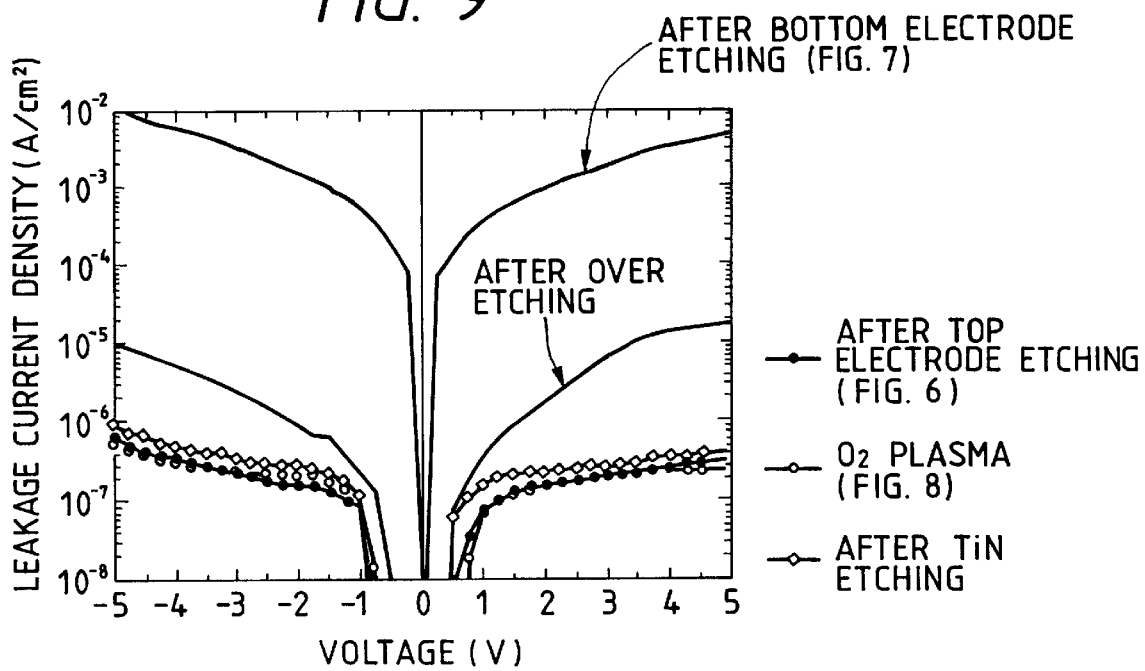
FIG. 9 shows characteristics curves indicating a relationship between the voltage and leakage current density of the capacitor according to the invention after the fabrication processes of FIGS. 6 through 8.

FIG. 9 shows comparisons of the leakage current density and voltage characteristics of the ferroelectric capacitor obtained after the etching of the top electrode shown in FIG. 6, after the etching of the bottom electrode shown in FIG. 7, after the over etching, after the oxygen plasma processing of FIG. 8, and after the etching of the diffusion barrier layer. After the top electrode etching, the leakage current density is on a order of $10^{-7}$ $A/cm^2$. After the bottom electrode etching, the platinum-contained deposits on the ferroelectric film sidewalls short-circuit the top and bottom electrodes. Removing these platinum-contained deposits by 30% over-etching decreases the leakage current density to an order of $10^{-5}$ $A/cm^2$. However, this value is larger than that obtained after the top electrode etching by an order of magnitude or more because the ferroelectric film sidewalls are exposed to the plasma to cause oxygen defects. When the oxygen defects on the ferroelectric film sidewalls are remedied by oxygen plasma processing, the leakage current density decreases to the generally same level as that observed after the top electrode etching. Etching of the diffusion barrier layer does not indicate an increase in the leakage current density either.

Figure 11:
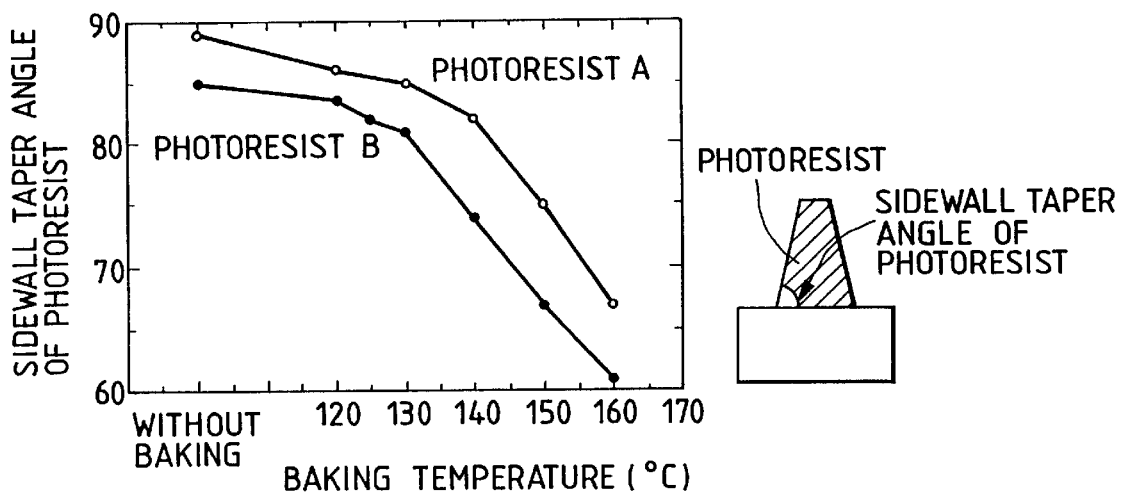
FIG. 11 shows characteristics curves indicating a relationship between baking temperature and photoresist sidewall taper angle.
Figure 12:
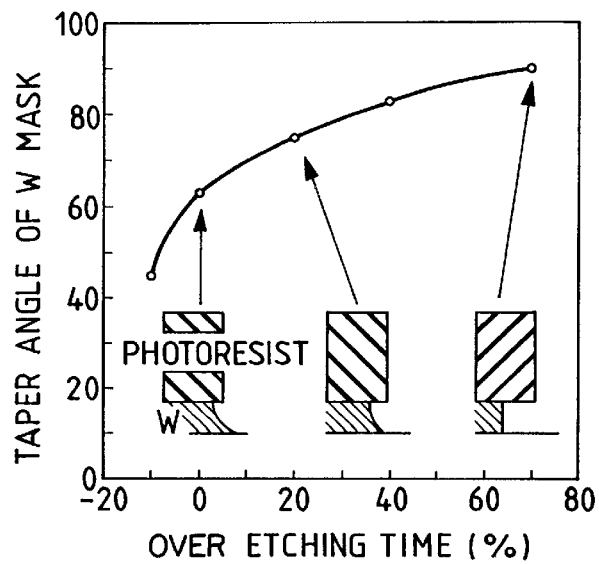
FIG. 12 shows characteristics curves indicating a relationship between over-etching time and tungsten mask taper angle.
Figure 13:
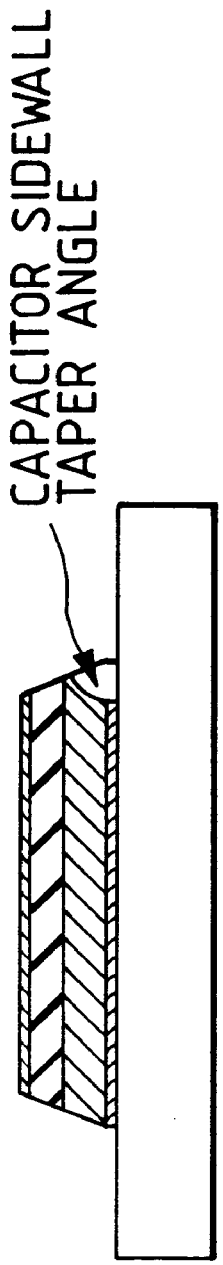
FIG. 13 shows capacitor short-circuit test results.
Figure 14:
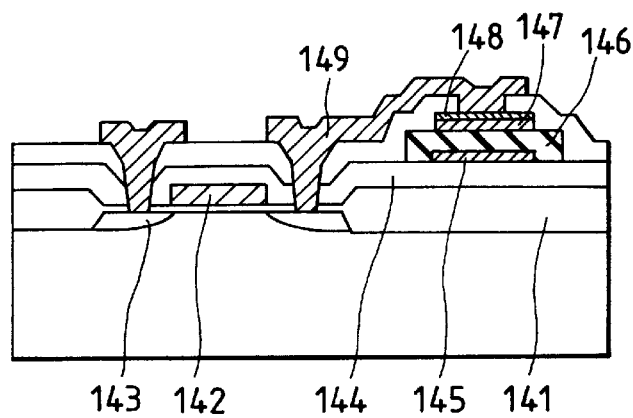
FIG. 14 is a cross section illustrating a prior-art memory cell.
Figure 15:
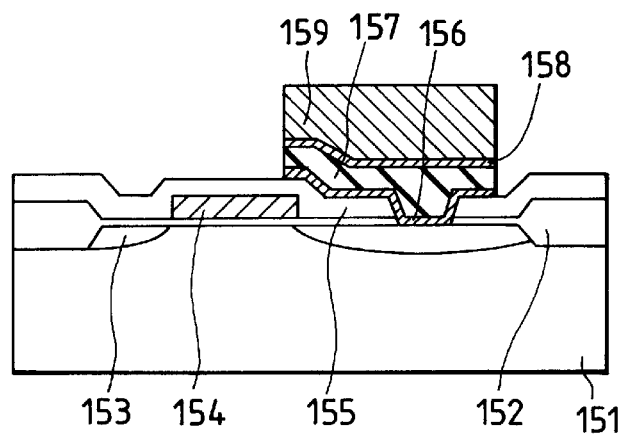
FIG. 15 is a cross section illustrating another prior-art memory cell.
Figure 16:
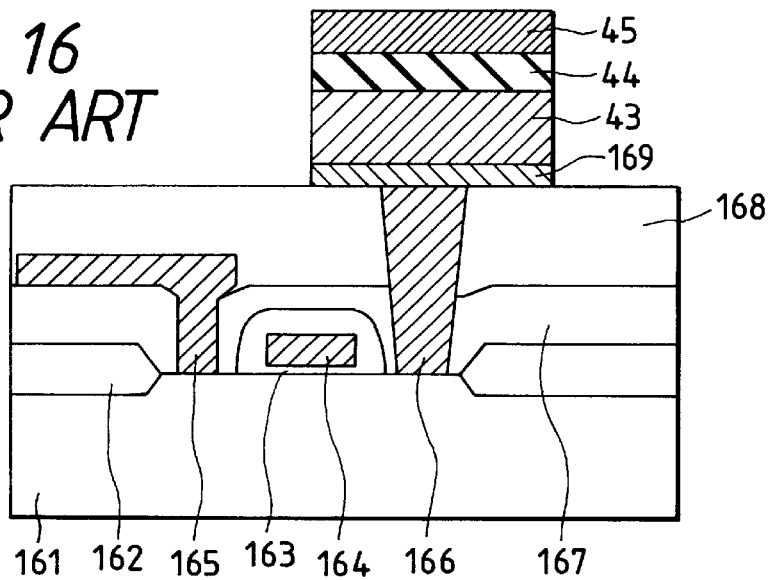
FIG. 16 is a cross section illustrating still another prior-art memory cell.

In the present embodiment, the tungsten 46 that provides the mask is formed by isotropy dry etching into a trapezoid in cross section. It will be apparent that, as described above with reference to FIG. 11, the tungsten 46 may be formed by anisotropic dry etching into a trapezoid in cross section after forming the photoresist 51 into a trapezoid in cross section by setting the baking temperature of the photoresist 51 to a range of 140° C. to 160° C.

In the present embodiment, lead ziroconate tintanate is used for ferroelectric film 44. It will be apparent that the material for the ferroelectric film is not limited to lead zirconate titanate; also available are, by way of example, perovskite-type oxides such as lead titanate, strontium titanate, and barium titanate, solid solutions of these, and bismuth-type layer-structured ferroelectric oxides.

In the present embodiment, TiN is used for the diffusion barrier layer 42. It will be apparent that the same effect can be obtained by use of Ti or Ta or by stacking a plurality of materials selected from TiN, Ti, and Ta.

As described and according to the invention, etching the top electrode, the ferroelectric film and the bottom electrode with single photolithography process step does not cause short-circuit between the top and bottom electrodes, thereby allowing the fabrication of the memory cell of a small cell area suitable for highly integrated memory devices. Use of the memory cell according to the present invention can implement not only a high integrated DRAM (Dynamic Random Access Memory) and a highly integrated ferroelectric nonvolatile memory, but also a high-performance LSI (Large Scale Integration) in which these memory cells and a logic LSI are integrated on one chip and a field-programmable logic LSI that allows modification of wiring by the ferroelectric nonvolatile memory. It will be apparent that the effect of the present invention is by any means restricted to the memory cell of the above-mentioned embodiment; rather, the effect of the present invention extends to all semiconductor devices including LSIs for communications applications that use the ferroelectric capacitor.

While the preferred embodiment of the present invention has been described using specific terms, such description is for illustrative purposes only, and it is to be understood that changes and variations may be made without departing from the spirit or scope of the appended claims.

What is claimed is:

1. A semiconductor device having a capacitor composed of a bottom electrode, a dielectric film, and a top electrode formed on a substrate, wherein said bottom electrode is made of platinum and an angle of each of main cross sectional sides of said dielectric film relative to a main surface of said substrate is less than 75 degrees.

2. A semiconductor device as claimed in claim 1, wherein said top electrode is made of platinum.

3. A semiconductor device having a capacitor composed of a bottom electrode, dielectric film, and a top electrode formed on a substrate, wherein said bottom electrode is made of platinum or a conductive material containing platinum and an angle of each of main cross sectional sides of said dielectric film relative to a surface on which said bottom electrode is formed is less than 75 degrees.

4. A semiconductor device having a capacitor composed of a bottom electrode, a dielectric film, and a top electrode formed on a substrate, wherein said bottom electrode is made of platinum or a conductive material containing platinum and an angle of each of main cross sectional sides of said dielectric film relative to a surface on which said bottom electrode is formed is in a range of 45 degrees to 75 degrees.

5. A semiconductor device having a switching transistor and a ferroelectric capacitor integrated on a same substrate, wherein a top electrode, a ferroelectric film, a bottom electrode, and a diffusion barrier layer of said ferroelectric capacitor are etched with a same mask and said ferroelectric capacitor is trapezoid in cross section, an angle of sides of which is less than 75 degrees relative to a main surface of said same substrate.

6. A semiconductor device as claimed in claim 5, wherein said ferroelectric film is made of a perovskite-type oxide ferroelectric material such as lead titanate, strontium titanate, barium titanate, or lead zirconate titanate, a solid solution thereof, or a bismuth-type layer-structured ferroelectric material.

7. A dynamic random access memory at least having a semiconductor device as claimed in claim 5, on one semiconductor substrate.

8. A ferroelectric nonvolatile memory at least having a semiconductor device as claimed in claim 5, on one same semiconductor substrate.

9. An integrated circuit device integrated on one semiconductor chip with at least one of a dynamic random access memory as claimed in claim 7, and a ferroelectric nonvolatile memory as claimed in claim 8.

10. A semiconductor device, comprising:

a semiconductor substrate;

a switching transistor formed on said semiconductor substrate;

an interlayer insulating film covering said semiconductor substrate and said switching transistor; and a capacitor formed on said interlayer insulating film and having a top electrode, a ferroelectric film and a bottom electrode;

wherein said capacitor is formed by etching said top electrode, said ferroelectric film and said bottom electrode with a single mask, said capacitor is trapezoidal in cross section, and an angle of sides of which is less than 75 degrees relative to a surface of said semiconductor substrate.

11. A semiconductor device, comprising:

a semiconductor substrate;

a switching transistor formed on said semiconductor substrate;

an interlayer insulating film covering said semiconductor substrate and said switching transistor; and a capacitor formed on said interlayer insulating film and having a top electrode, a ferroelectric film and a bottom electrode;

wherein, said top electrode, said ferroelectric film and said bottom electrode of said capacitor are formed by collective etching with the same mask, and an angle of a sidewall of said ferroelectric film is less than 75 degrees relative to an upper surface of said interlayer insulating film.

12. A semiconductor device, comprising;

a semiconductor substrate;

a switching transistor formed on said semiconductor substrate;

an interlayer insulating film covering said semiconductor substrate and said switching transistor; and a capacitor formed on said interlayer insulating film and having a top electrode, a ferroelectric film and a bottom electrode;

wherein, said top electrode, said ferroelectric film and said bottom electrode of said capacitor are similar in plane shape, each center of said top electrode, said ferroelectric film and said bottom electrode is overlapping, said capacitor is trapezoidal in cross section, and an angle of sides of said capacitor is less than 75 degrees relative to a surface of said semiconductor substrate.

13. A semiconductor device as claimed in claim 10, wherein said bottom electrode is made of platinum or a conductive material containing platinum.

14. A semiconductor device as claimed in claim 10, wherein said ferroelectric film is made of either a bismuth-type of ferroelectric material or a perovskite-type of ferroelectric material selected from a group of lead zirconate, lead titanate, strontium titanate, and barium titanate.

15. A semiconductor device as claimed in claim 11, wherein said bottom electrode is made of platinum or a conductive material containing platinum.

16. A semiconductor device as claimed in claim 11, wherein said ferroelectric film is made of either a bismuth-type of ferroelectric material or a perovskite-type of ferroelectric material selected from a group of lead zirconate, lead titanate, strontium titanate, and barium titanate.

17. A semiconductor device as claimed in claim 12, wherein said bottom electrode is made of platinum or a conductive material containing platinum.

18. A semiconductor device as claimed in claim 12, wherein said ferroelectric film is made of either a bismuth-type of ferroelectric material or a perovskite-type of ferroelectric material selected from a group of lead zirconate, lead titanate, strontium titanate, and barium titanate.

* * * * *